US008871562B2

(12) United States Patent
Zhang et al.

(10) Patent No.: US 8,871,562 B2
(45) Date of Patent: Oct. 28, 2014

(54) ORGANIC THIN FILM TRANSISTOR ARRAY SUBSTRATE AND METHOD FOR MANUFACTURING THE SAME, AND DISPLAY DEVICE

(75) Inventors: Xuehui Zhang, Beijing (CN); Jianshe Xue, Beijing (CN); Xiang Liu, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 14 days.

(21) Appl. No.: 13/698,906

(22) PCT Filed: Aug. 13, 2012

(86) PCT No.: PCT/CN2012/080026
§ 371 (c)(1),
(2), (4) Date: Nov. 19, 2012

(87) PCT Pub. No.: WO2013/026360
PCT Pub. Date: Feb. 28, 2013

(65) Prior Publication Data
US 2013/0134399 A1  May 30, 2013

(30) Foreign Application Priority Data
Aug. 24, 2011 (CN) .......................... 2011 1 0247820

(51) Int. Cl.
*H01L 21/00* (2006.01)
*H01L 51/00* (2006.01)
*H01L 51/10* (2006.01)
*H01L 27/32* (2006.01)
*H01L 51/05* (2006.01)

(52) U.S. Cl.
CPC ......... *H01L 51/0516* (2013.01); *H01L 27/3274* (2013.01); *H01L 51/0541* (2013.01); *H01L 51/0018* (2013.01); *H01L 51/0023* (2013.01); *H01L 51/102* (2013.01)
USPC .............................................. 438/99; 257/40

(58) Field of Classification Search
CPC .................................. H01L 51/0516

USPC ............................................................ 438/99
See application file for complete search history.

(56) References Cited

U.S. PATENT DOCUMENTS

2001/0052597 A1* 12/2001 Young et al. .................... 257/59
2006/0081849 A1    4/2006 Lee et al.

(Continued)

FOREIGN PATENT DOCUMENTS

| CN | 1959510 A   | 5/2007 |
| CN | 101105615 A | 1/2008 |

(Continued)

OTHER PUBLICATIONS

International Search Report mailed Nov. 15, 2012; PCT/CN/2012/080026.

(Continued)

*Primary Examiner* — Lex Malsawma
(74) *Attorney, Agent, or Firm* — Ladas & Parry LLP

(57) ABSTRACT

According to the present invention, there is provided an organic thin film transistor array substrate and a method for manufacturing the same and a display device. The method for manufacturing the organic thin film transistor array substrate comprises: forming a pattern comprising a source electrode, a drain electrode, a data line and a pixel electrode on a transparent substrate through a first patterning process; forming an organic semiconductor pattern, a gate insulating layer pattern, a pattern comprising a gate electrode and a gate line through a second patterning process on the transparent substrate after the first patterning process; depositing a passivation layer on the transparent substrate after the second patterning process, and forming a pattern comprising a data line pad region, a gate line pad region and a pixel pad region through a third patterning process; and forming a pattern of a common electrode on the transparent substrate after the third patterning process through a fourth patterning process. The technical solutions of the present invention can increase production efficiency of the organic thin film transistor array substrate and reduce production costs.

18 Claims, 7 Drawing Sheets

(56) References Cited

U.S. PATENT DOCUMENTS

| 2008/0002124 | A1* | 1/2008 | Yang | 349/139 |
| 2008/0049158 | A1* | 2/2008 | Choi | 349/46 |
| 2011/0095295 | A1 | 4/2011 | Nam | |
| 2012/0094409 | A1 | 4/2012 | Zhi et al. | |
| 2012/0271044 | A1 | 10/2012 | Chang et al. | |

FOREIGN PATENT DOCUMENTS

| CN | 101131517 A | 2/2008 |
| CN | 101630098 A | 1/2010 |
| CN | 101840117 A | 9/2010 |
| CN | 102054833 A | 5/2011 |
| CN | 102054846 A | 5/2011 |
| KR | 20080001105 A | 1/2008 |
| KR | 20110070092 A | 6/2011 |

OTHER PUBLICATIONS

First CHinese Office Action dated Aug. 28, 2013; Appln. No. 201110247820.7.

First Korean Office Action dated Dec. 27, 2013; Appln. No. 10-2012-7031414.

Chinese Office Action Rejection Decision dated Jan. 6, 2014; Appln. No. 201110247820.7.

International Preliminary Report on Patentability dated Feb. 25, 2014; PCT/CN2012/080026.

* cited by examiner

ORGANIC THIN FILM TRANSISTOR ARRAY SUBSTRATE AND METHOD FOR MANUFACTURING THE SAME, AND DISPLAY DEVICE

CROSS REFERENCE TO RELATED APPLICATIONS

This application is a national stage application under 35 U.S.C. 371 and claims the benefit of PCT Application No. PCT/CN2012/080026 having an international filing date of Aug. 13, 2012, which designated the United States, which PCT application claimed the benefit of Chinese Application No. 201110247820.7 filed Aug. 24, 2011, the disclosure of both the above-identified applications are incorporated herein by reference.

TECHNICAL FIELD

Embodiments of the present invention relate to an organic thin film transistor array substrate and a method for manufacturing the same, and a display device.

BACKGROUND

An organic thin film transistor (OTFT) is a logic unit device using an organic semiconductor as an active layer, has advantages of being adaptable for large-scale processing, being applicable for flexible substrates, low process cost, etc., and possesses application prospects in the fields of flat panel display, sensor, storage card, radio frequency identification tag, etc. Thus, research and development on organic thin film transistors have gotten great international attentions.

In the prior art, an organic thin film transistor array substrate is usually produced by using a patterning process. It is necessary that a mask pattern should be transferred into a thin film pattern in each patterning process, and each pattern layer should be precisely overlapped with another layer of thin film pattern. At present, five patterning processes are generally needed to produce an organic thin film transistor array substrate. Thus, the number of the used mask is larger, the production efficiency is lower, and the production cost is higher.

SUMMARY

A technical problem which the present invention is intended to solve is to provide an organic thin film transistor array substrate and a method for manufacturing the same, and a display device, capable of enhancing production efficiency of the organic thin film transistor array substrate and decreasing production costs.

According to one aspect of the present invention, there is provided a method for manufacturing an organic thin film transistor array substrate comprising: forming a pattern comprising a source electrode, a drain electrode, a data line and a pixel electrode on a transparent substrate through a first patterning process; forming an organic semiconductor pattern, a gate insulating layer pattern, a pattern comprising a gate electrode and a gate line through a second patterning process on the transparent substrate after the first patterning process; depositing a passivation layer on the transparent substrate after the second patterning process, and forming a pattern comprising a data line pad region, a gate line pad region and a pixel pad region through a third patterning process; and forming a pattern of a common electrode on the transparent substrate after the third patterning process through a fourth patterning process.

According to another aspect of the present invention, there is also provided an organic thin film transistor array substrate comprising: a transparent substrate; a pixel electrode disposed on the transparent substrate; a source electrode, a drain electrode and a data line disposed on the transparent substrate; an organic semiconductor pattern disposed on the transparent substrate; a gate insulating layer pattern disposed on the transparent substrate; a gate electrode and a gate line disposed on the transparent substrate; a passivation layer disposed on the transparent substrate and a data line pad region, a gate line pad region and a pixel pad region formed in the passivation layer; and a common electrode disposed on the transparent substrate.

In the above embodiments, the organic thin film transistor array substrate may be produced by using a four-time patterning process. By means of forming the source and drain electrodes, the data line and the pixel electrode in one patterning process, and forming the organic semiconductor pattern, the gate electrode, the gate line and the insulating layer pattern in one patterning process, the production process of the organic thin film transistor array substrate is simplified, production costs is reduced, the production time period is shortened, and production efficiency is improved.

BRIEF DESCRIPTION OF THE DRAWINGS

In order to clearly illustrate the technical solution of the embodiments of the invention, the drawings of the embodiments will be briefly described in the following; it is obvious that the described drawings below are only related to some embodiments of the invention and thus are not limitative of the invention.

DETAILED DESCRIPTION

To make the technical problems aimed to be solved by embodiments of the present invention, technical solutions and advantages clearer, thereinafter, descriptions will be made in detail in connection with the accompanying drawings and specific embodiments.

Embodiment 1

With respect to the problem in prior art that, in manufacture of an organic thin film transistor array substrate, the number of the used mask is larger, production efficiency is lower and production costs are higher, according to an embodiment of the present invention, there is provided a method for manufacturing an organic thin film transistor array substrate, capable of enhancing production efficiency of the organic thin film transistor array substrate and decreasing production costs.

Figure 1:
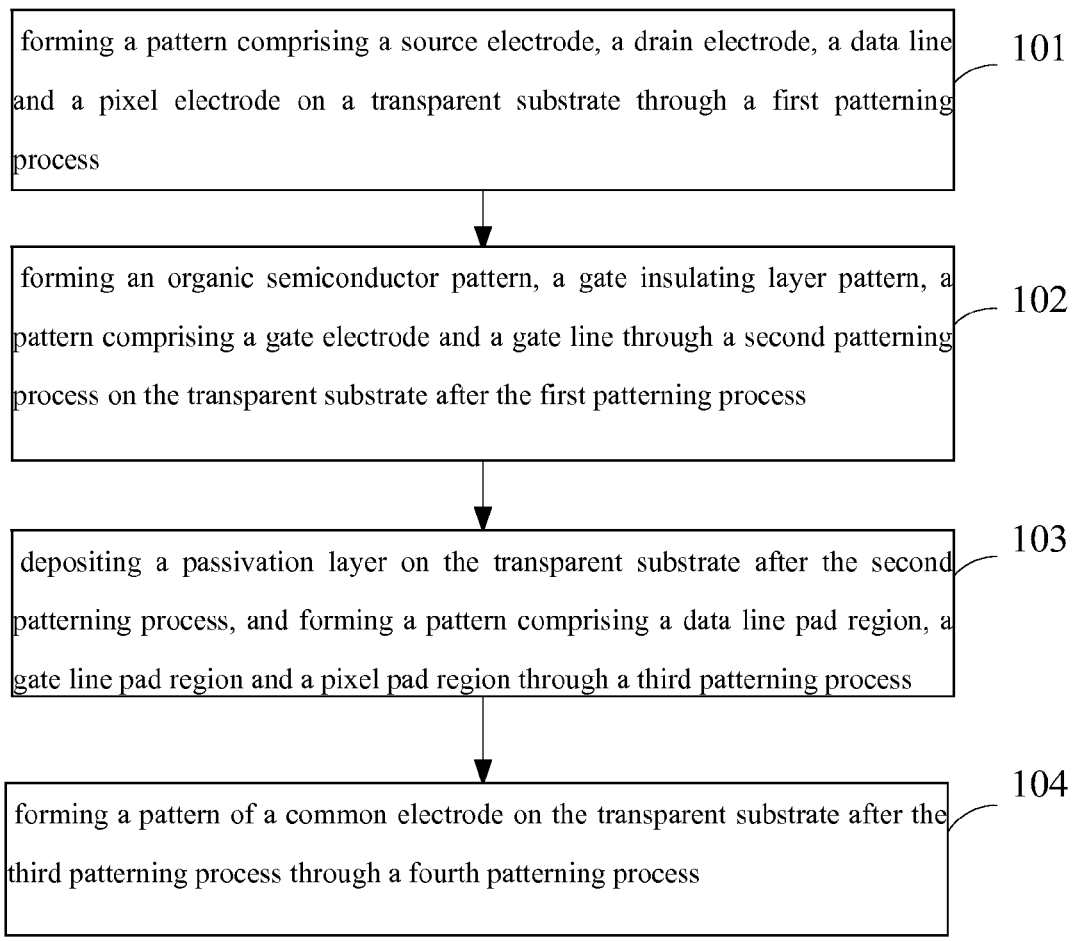
FIG. 1 is a schematically flow chart showing a method for manufacturing an organic thin film transistor array substrate (OTFT), according to an embodiment of the present invention.

FIG. 1 is a schematically flow chart showing a method for manufacturing an organic thin film transistor array substrate according to an embodiment of the present invention. As shown in FIG. 1, the embodiment comprises the following steps.

Step 101: forming a pattern comprising a source electrode, a drain electrode, a data line and a pixel electrode on a transparent substrate through a first patterning process;

Step 102: forming an organic semiconductor pattern, a gate insulating layer pattern, a pattern comprising a gate electrode and a gate line through a second patterning process on the transparent substrate after the first patterning process;

Step 103: depositing a passivation layer on the transparent substrate after the second patterning process, and forming a pattern comprising a data line pad region, a gate line pad region and a pixel pad region through a third patterning process; and Step 104: forming a pattern of a common electrode on the transparent substrate after the third patterning process through a fourth patterning process.

The organic semiconductor pattern is the active layer pattern of the thin film transistor to be produced.

The method for manufacturing the organic thin film transistor array substrate according to the embodiment uses a four-time patterning process to manufacture the organic thin film transistor array substrate, and simplifies production process of the organic thin film transistor array substrate, reduces production costs, shortens production time period and improves production efficiency, by forming the source and drain electrodes, the data line and the pixel electrode in one patterning process and forming the organic semiconductor pattern, the gate electrode, the gate line and the insulating layer pattern in one patterning process.

Hereinafter, an example of the embodiment of the method for manufacturing the organic thin film transistor array substrate is described in connection with the accompanying drawings, the embodiment comprises the following steps.

Figure 3A:
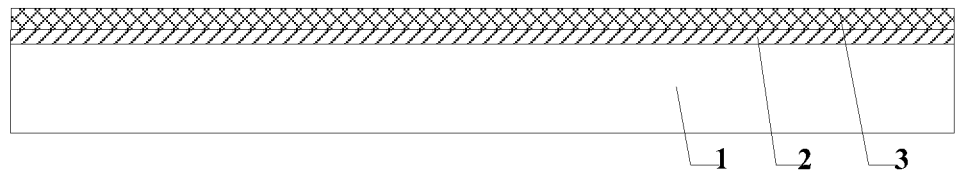
FIG. 3a is a schematically cross-sectional view after a first transparent conductive layer and a first metal layer are formed, according to an embodiment of the present invention.

Step 1: firstly, a transparent conductive thin film 2 is deposited by means of sputtering on a transparent substrate 1, and the transparent conductive thin film 2 is a first transparent conductive layer; then, a source-drain metal thin film 3 is formed on the transparent conductive thin film 2, and the source-drain metal thin film 3 is a first metal layer. FIG. 3a is a schematically cross-sectional view after the transparent conductive thin film 2 and the source-drain metal thin film 3 are formed on the transparent substrate 1. The transparent substrate 1 is, for example, a glass substrate or a plastic substrate. The material of transparent conductive thin film 2 is, for example, indium tin oxide (ITO), indium zinc oxide (IZO), or the like. The first metal layer is, for example, aluminum or aluminum alloy.

Figure 3B:
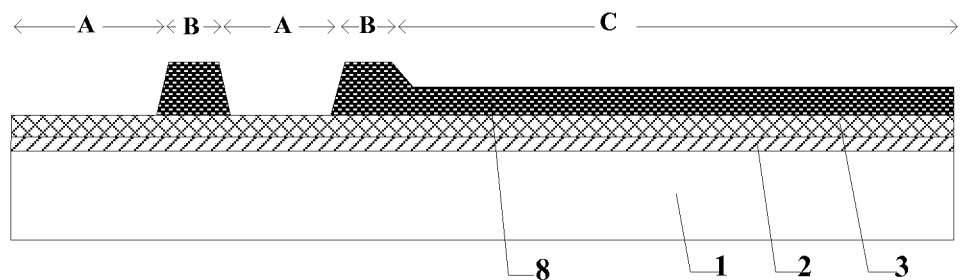
FIG. 3b is a schematically cross-sectional view showing an OTFT array substrate after an exposure and development using a half-tone or gray-tone mask in a first patterning process, according to the embodiment of the present invention.

Next, a photoresist layer 8 is coated, and is exposed with a half-tone or gray-tone mask and developed, and FIG. 3b is a schematically cross-sectional view showing an OTFT array substrate after exposure and development using the half-tone or gray-tone mask in the first patterning process according to the embodiment of the present invention. In FIG. 3b, an area A is a photoresist removed area, an area C is a photoresist partially-retained area, and an area B is a photoresist fully-retained area, and the photoresist in the areas A-C has different thickness. The photoresist fully-retained area corresponds to a pattern region for forming the source electrode, the drain electrode and the data line, the photoresist partially-retained area corresponds to a pattern region for forming the pixel electrode, and the photoresist fully-removed area corresponds to a region except the photoresist fully-retained area and the photoresist partially-retained area, which includes a region for forming a channel region of the thin film transistor.

Figure 3C:
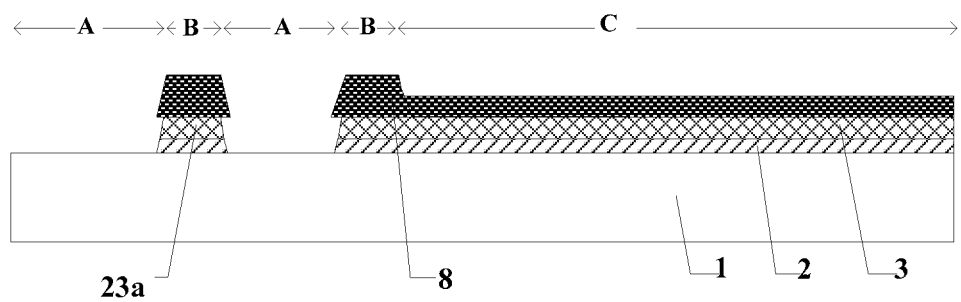
FIG. 3c is a schematically cross-sectional view showing the OTFT array substrate after a first etching in the first patterning process, according to the embodiment of the present invention.

A first etching is performed on the OTFT array substrate shown in FIG. 3b so as to remove by etching the transparent conductive thin film and the source-drain metal thin film in the photoresist fully-removed area. FIG. 3c is a schematically cross-sectional view showing the OTFT array substrate after the first etching in the first patterning process, according to the embodiment of the present invention.

Figure 3D:
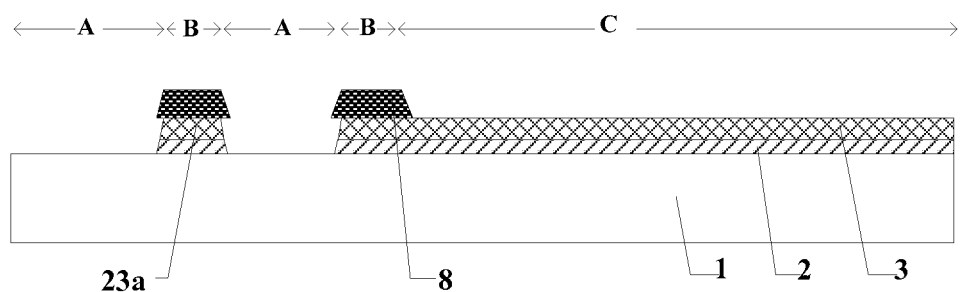
FIG. 3d is a schematically cross-sectional view showing the OTFT array substrate after an ashing is performed on a photoresist in a second patterning process, according to the embodiment of the present invention.

Subsequently, an ashing is performed on the photoresist on the OTFT array substrate as shown in FIG. 3c so as to remove the photoresist in the photoresist partial-retained area. FIG. 3d is a schematically cross-sectional view showing the OTFT array substrate after the ashing is performed on the photoresist in the first patterning process, according to the embodiment of the present invention.

Figure 3E:
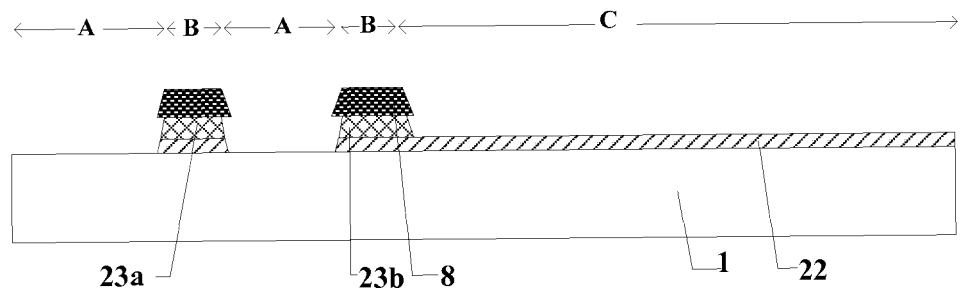
FIG. 3e is a schematically cross-sectional view showing the OTFT array substrate after a second etching in the first patterning process, according to the embodiment of the present invention.
Figure 3F:
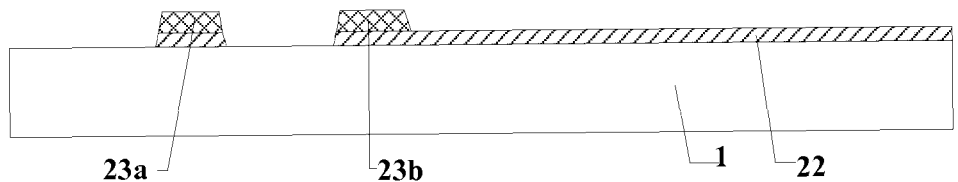
FIG. 3f is a schematically cross-sectional view showing the OTFT array substrate after the photoresist is removed in the first patterning process, according to the embodiment of the present invention.
Figure 3G:
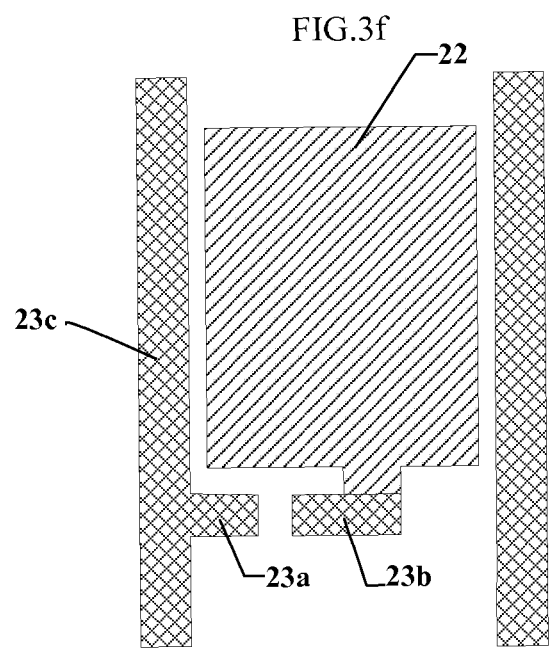
FIG. 3g is a schematically plan view showing the OTFT array substrate after the photoresist is removed in the first patterning process, according to the embodiment of the present invention.

Next, a second etching is performed on the OTFT array substrate shown in FIG. 3d so as to remove by etching the source-drain metal layer thin film in the photoresist partially-retained area and to obtain a pixel electrode 20 (also refer to FIG. 3g). FIG. 3e is a schematically cross-sectional view showing the OTFT array substrate after the second etching in the first patterning process, according to the embodiment of the present invention, and a source electrode 23a, a drain electrode 23b and a data line 23c (also refer to FIG. 3g) are formed after the second etching.

After the photoresist is removed, a schematically cross-sectional view, as shown in FIG. 3f, showing the OTFT array substrate after the photoresist is removed in the first patterning process, according to the embodiment of the present invention is obtained; and FIG. 3g is a plan view showing the OTFT array substrate after the photoresist is removed in the first patterning process, according to the embodiment of the present invention.

Step 2: on the basis of the completed step 1, an organic semiconductor thin film 4 is deposited. The method for depositing the organic semiconductor thin film 4 includes vacuum evaporation or the like method. The material for the organic semiconductor layer can be an organic semiconductor of Vanadyl phthalocyanine. The thickness of the organic semiconductor layer involved in the embodiment is 30-150 nm, and preferably 50 nm. When the thickness is 50 nm, and an organic semiconductor pattern (an active layer) formed by the organic semiconductor layer has better carrier mobility and can achieve a better display effect.

Next, by means of spin-coating, a gate insulating layer thin film 5 is formed. The material for the gate insulating layer thin film 5 may be polyvinyl phenol (PVP) or the like, and the method to produce the gate insulating layer thin film 5 also may be other conventional methods beside the spin-coating. The gate insulating layer involved in the embodiment is baked for 5-25 minutes before the temperature reaches 60-100 centigrade (° C.) and baked for 5-25 minutes after the temperature reaches 100-180° C., and thickness of the gate insulating layer is 250-600 nm. Preferably, the gate insulating layer thin film after baking for 20 minutes before the temperature reaches 100° C. and baking for 20 minutes after the temperature reaches 130° C. has a thickness of 550 nm. The gate insulating layer thin film formed as such can achieve both a proper insulating effect and a proper thickness of the film layer, thus realizing a better technical effect.

Figure 4A:
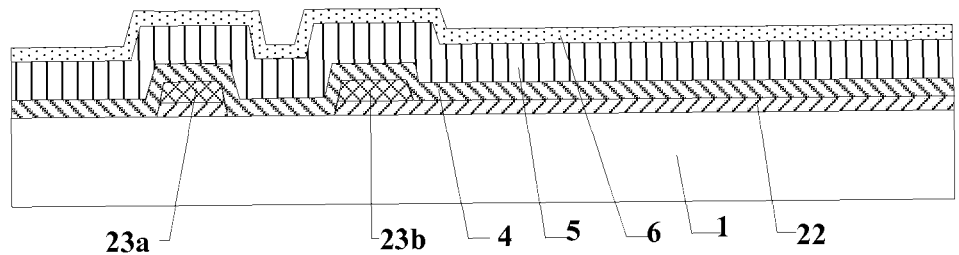
FIG. 4a is a schematically cross-sectional view showing the OTFT array substrate after an organic semiconductor layer, an insulating layer and a second metal layer are manufactured, according to the embodiment of the present invention.

Subsequently, by means of sputtering, for example, a Mo metal thin film 6 is deposited as a gate metal thin film, i.e., a second metal layer. FIG. 4a is a schematically cross-sectional view after the organic semiconductor layer, the insulating layer and a gate electrode thin film are manufactured, according to the embodiment of the present invention.

Figure 4B:
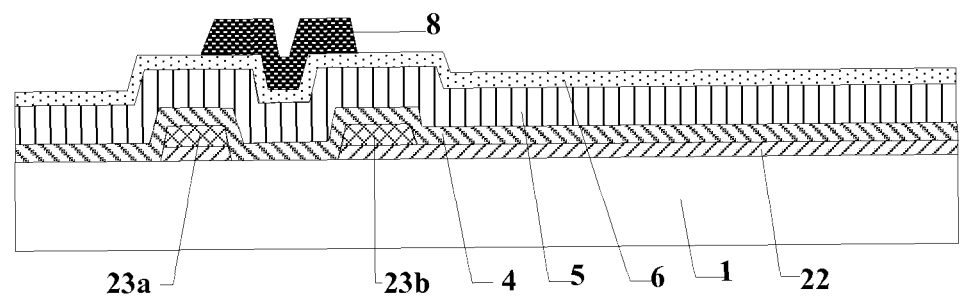
FIG. 4b is a schematically cross-sectional view showing the OTFT array substrate after an exposure and development in a second patterning process, according to the embodiment of the present invention.

A photoresist layer 8 is spin-coated and is exposed and developed. FIG. 4b is a schematically cross-sectional view showing the OTFT array substrate after exposure and development in a second patterning process, according to the embodiment of the present invention.

Figure 4C:
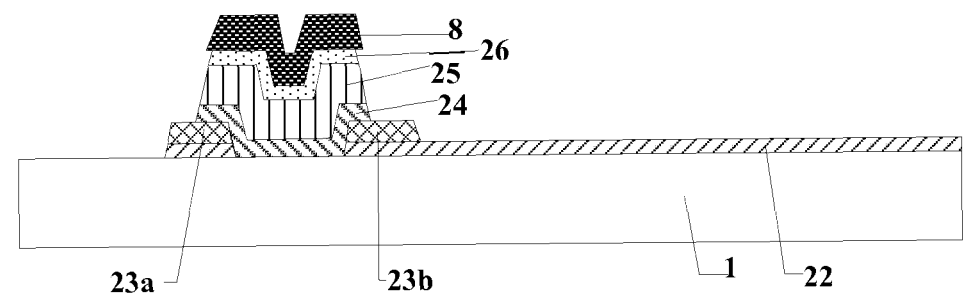
FIG. 4c is a schematically cross-sectional view showing the OTFT array substrate after an etching in the second patterning process, according to the embodiment of the present invention.

An etching is performed on the OTFT array substrate as shown in FIG. 4b so as to remove by etching the gate-electrode metal layer thin film, the insulating layer thin film and the organic semiconductor layer thin film in a photoresist fully-removed area. FIG. 4c is a schematically cross-sectional view showing the OTFT array substrate after the etching in the second patterning process, according to the embodiment of the present invention.

Figure 4D:
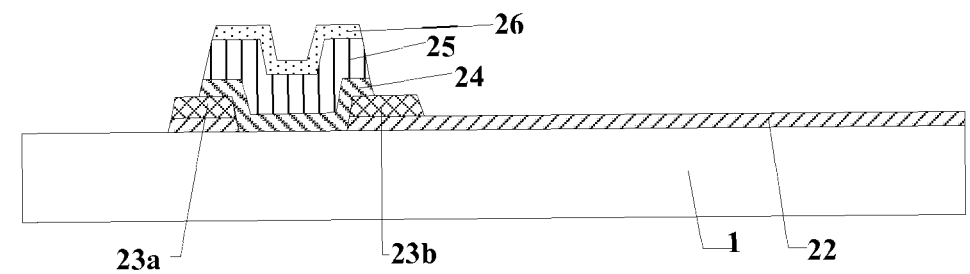
FIG. 4d is a schematically cross-sectional view showing the OTFT array substrate after the second patterning process, according to the embodiment of the present invention.
Figure 4E:
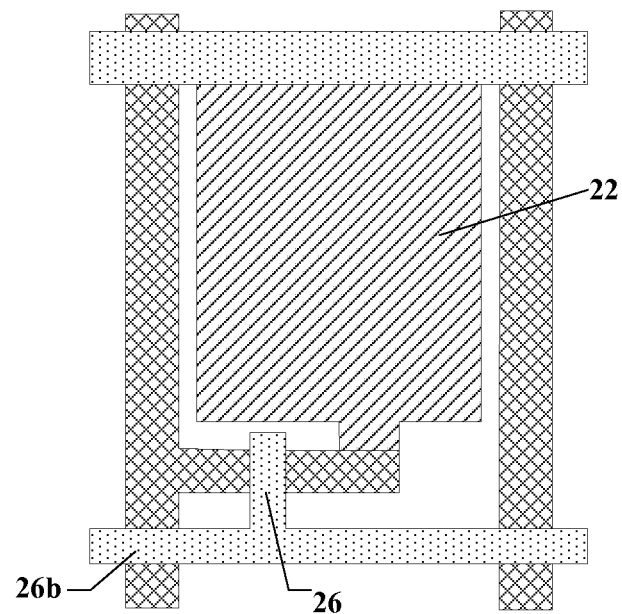
FIG. 4e is a schematically plan view showing the OTFT array substrate after the second patterning process, according to the embodiment of the present invention.

Next, the photoresist on the OTFT array substrate shown in FIG. 4c is removed, to obtain a schematically cross-sectional view showing the OTFT array substrate after the second patterning process, as shown in FIG. 4d, according to the embodiment of the present invention. Accordingly, an organic semiconductor pattern 24, a gate insulating layer pattern 25, a gate electrode 26 and a gate line 26b connected thereto (refer to FIG. 4e) are obtained after patterning. FIG. 4e is a plan view showing the OTFT array substrate after the second patterning process, according to the embodiment of the present invention.

Figure 5:
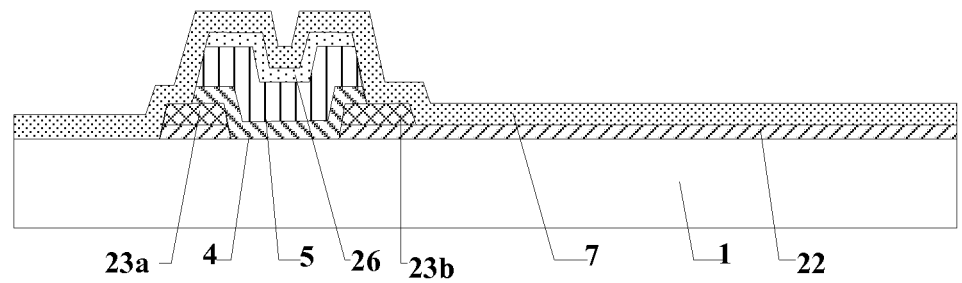
FIG. 5 is a schematically cross-sectional view showing the OTFT array substrate after a third patterning process, according to the embodiment of the present invention.

Step 3: a passivation layer 7 is deposited on the transparent substrate after the step 2, and after deposition of the passivation layer thin film, the passivation layer in a data line pad area, a gate line pad area and a part of the region of the drain electrode is fully removed by a third patterning process, so as to expose the data line pad area and the gate line pad area, forming a patterned passivation layer 27. FIG. 5 is a schematically cross-sectional view showing the OTFT array substrate after the third patterning process, according to the embodiment of the present invention.

Figure 6A:
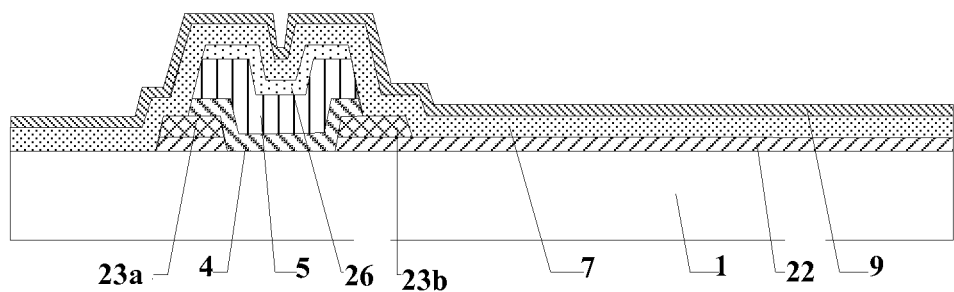
FIG. 6a is a schematically cross-sectional view showing the OTFT array substrate after a second transparent conductive layer is formed, according to the embodiment of the present invention.

Step 4; a transparent conductive thin film 9, i.e., a second transparent conductive layer is deposited on the transparent substrate after the step 3. FIG. 6a is a schematically cross-sectional view after the transparent conductive thin film is formed, according to the embodiment of the present invention.

Figure 6B:
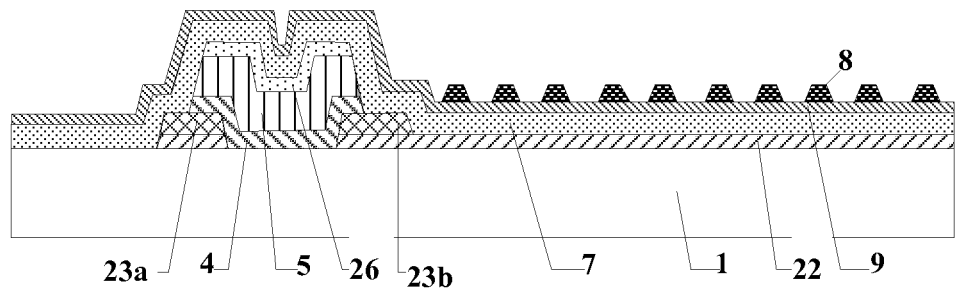
FIG. 6b is a schematically cross-sectional view showing the OTFT array substrate after an exposure and development in a fourth patterning process, according to the embodiment of the present invention.

Then, a photoresist layer 8 is spin-coated and is exposed and developed. FIG. 6b is a schematically cross-sectional view showing the OTFT array substrate after an exposure and development in a fourth patterning process, according to the embodiment of the present invention.

Figure 6C:
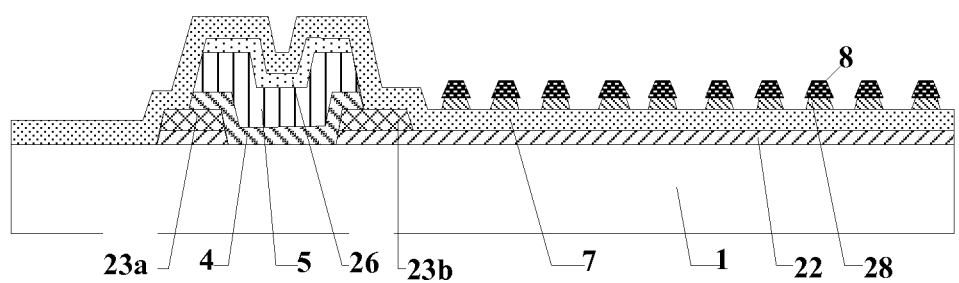
FIG. 6c is a schematically cross-sectional view showing the OTFT array substrate after an etching in the fourth patterning process, according to the embodiment of the present invention.

The transparent conductive thin film in a photoresist fully-removed area is removed by etching. FIG. 6c is a schematically cross-sectional view showing the OTFT array substrate after the etching in the fourth patterning process, according to the embodiment of the present invention.

Figure 6D:
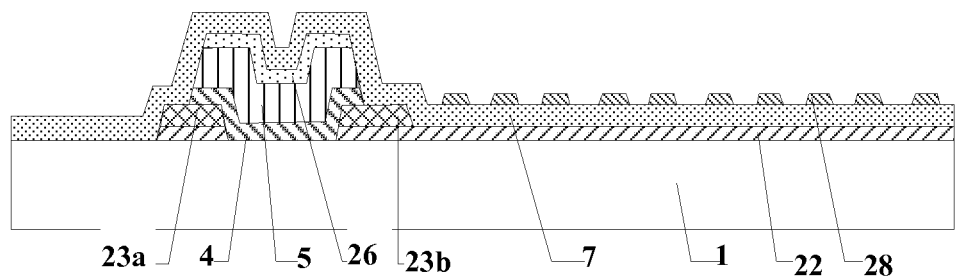
FIG. 6d is a schematically cross-sectional view showing the OTFT array substrate after a photoresist is removed in the fourth patterning process, according to the embodiment of the present invention.
Figure 6E:
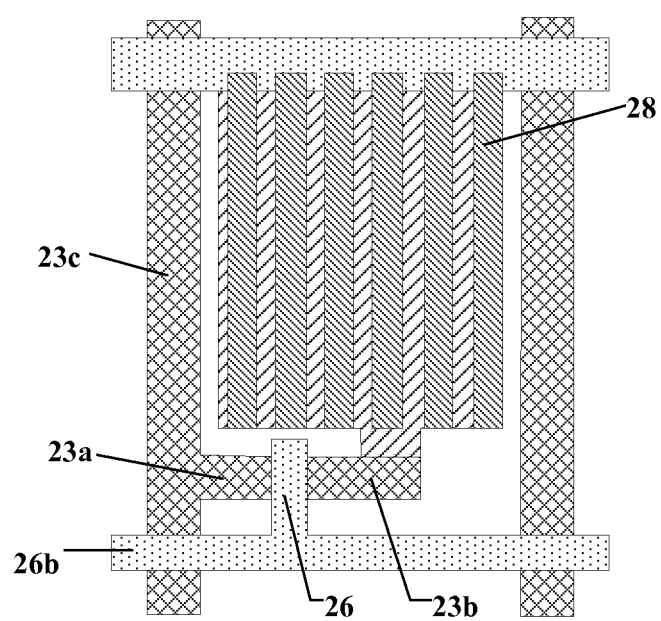
FIG. 6e is a schematically plan view showing the OTFT array substrate after the photoresist is removed in the fourth patterning process, according to the embodiment of the present invention.

Subsequently, photoresist removal is performed on the OTFT array substrate as shown in FIG. 6c to obtain a common electrode 28. FIG. 6d is a schematically cross-sectional view showing the OTFT array substrate after the photoresist is removed in the fourth patterning process, according to the embodiment of the present invention. FIG. 6e is a plan view showing the OTFT array substrate after the photoresist is removed in the fourth patterning process, according to the embodiment of the present invention. The common electrode 28 is, for example, a comb-like electrode or a plate-like electrode formed with slits.

The organic thin film transistor array substrate in the embodiment, which is produced by using the four-time patterning process, comprises the gate line and the data line, and the pixel electrode and the organic thin film transistor are formed within a pixel region defined by the gate line and the data line. The organic thin film transistor array substrate of the embodiment has a top-gate and bottom-contact configuration; the source electrode, the drain electrode and the pixel electrode are on an insulating substrate, the organic semiconductor layer is on the source and drain electrodes, the insulating layer is on the organic semiconductor layer, the gate electrode is on the insulating layer, the passivation layer is on the gate electrode, and lastly the common electrode is on the passivation layer. During manufacture, the production process of the organic thin film transistor array substrate is simplified, production costs is reduced, the production time period is shortened and production efficiency is improved, by forming the source and drain electrodes, the data line and the pixel electrode in one patterning process, and forming the organic semiconductor pattern, the gate electrode, the gate line and the insulating layer pattern in one patterning process.

Embodiment 2

According to thIS embodiment, there is provided an organic thin film transistor array substrate, and this array substrate is manufactured, for example, through the four-time patterning process as stated in the Embodiment 1.

Figure 2:
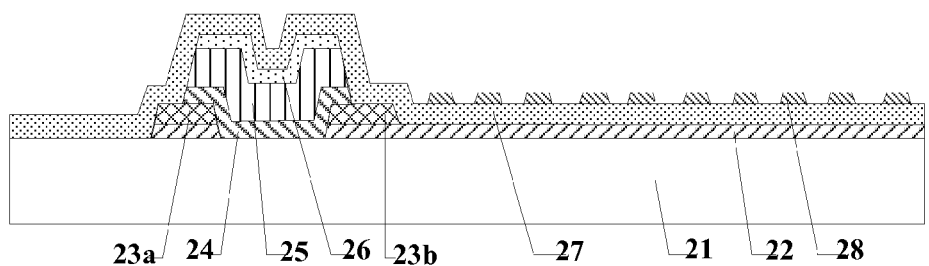
FIG. 2 is a structurally schematic view showing an organic thin film transistor array substrate, according to an embodiment of the present invention.

FIG. 2 is a structurally schematic view showing the organic thin film transistor array substrate according to the embodiment of the present invention. As shown in FIG. 2 (also refer to FIG. 6e), the organic thin film transistor array substrate according to the embodiment comprises:

a transparent substrate 21;

a pixel electrode 22 formed by a first transparent conductive layer and disposed on the transparent substrate 21;

a source electrode 23b, a drain electrode 23a and a data line formed by a first metal layer and disposed on the transparent substrate 21;

an organic semiconductor pattern 24 formed by an organic semiconductor layer and disposed on the transparent substrate 21;

a gate insulating layer pattern 25 formed by a gate insulating layer and disposed on the transparent substrate 21;

a gate electrode 26 and a gate line formed by a second metal layer and disposed on the transparent substrate 21;

a passivation layer 27 disposed on the transparent substrate 21, and a data line pad region, a gate line pad region and a pixel pad region formed in the passivation layer; and a common electrode 28 formed by a second transparent conductive layer and disposed on the transparent substrate 21.

The transparent substrate 21 is, for example, a glass or plastic substrate. The source electrode 23b is formed on the pixel electrode 22; the source electrode 23a and the data line (not shown) are integrally formed with a transparent conductive material layer retained thereunder. The organic semiconductor pattern 24 is formed over a channel region between the source electrode 23b and the drain electrode 23a. The gate insulating layer pattern 25 is formed over the organic semiconductor pattern 24. The gate electrode 26 and the gate line (not shown) are integrally formed and located above the organic semiconductor pattern 24. The passivation layer 27 covers the whole substrate 21; the common electrode 28 is formed on the passivation layer, and is, for example, a comb-like electrode or a plate-like electrode formed with slits.

Further, the thickness of the organic semiconductor layer is, for example, 30-150 nm.

Preferably, the thickness of the organic semiconductor layer is, for example, 50 nm. Here, an organic semiconductor pattern (an active layer) formed by the organic semiconductor layer has better carrier mobility, and can achieve a better display effect.

Further, the organic semiconductor layer is, for example, an organic semiconductor layer of Vanadyl phthalocyanine.

Further, the thickness of the gate insulating layer is, for example, 250-600 nm. Preferably, the thickness of the gate insulating layer is 550 nm, and the gate insulating layer thin film as such can achieve both a proper insulating effect and a proper thickness of the film layer, thus realizing a better technical effect.

Further, the gate insulating layer is, for example, an insulating layer of polyvinyl phenol.

The organic thin film transistor array substrate of this embodiment may be produced by using a four-time patterning process. During manufacture, the production process of the organic thin film transistor array substrate is simplified, production costs is reduced, the production time period is shortened, and production efficiency is improved, by forming the source and drain electrodes, the data line and the pixel electrode in one patterning process, and forming the organic semiconductor pattern, the gate electrode, the gate line and the insulating layer pattern in one patterning process.

According to an embodiment of the present invention, there is also provided a display device, comprising the above organic thin film transistor array substrate, and the display device comprises a liquid crystal panel, a liquid crystal television, a liquid crystal display device, a digital photo frame, an electronic paper, a cell phone, and so on.

The foregoing is the preferred embodiments of the present invention. It should be noted that, a number of modifications and variations can be made by those skilled in the technical field without departing from the spirit and scope of the present invention. These modifications and variations also come within the scope of the present invention.

The invention claimed is:

1. A method for manufacturing an organic thin film transistor array substrate, comprising:
   forming a pattern comprising a source electrode, a drain electrode, a data line and a pixel electrode on a transparent substrate through a first patterning process;
   forming an organic semiconductor pattern, a gate insulating layer pattern, a pattern comprising a gate electrode and a gate line through a second patterning process on the transparent substrate after the first patterning process;
   depositing a passivation layer on the transparent substrate after the second patterning process, and forming a pattern comprising a data line pad region, a gate line pad region and a pixel pad region through a third patterning process; and
   forming a pattern of a common electrode on the transparent substrate after the third patterning process through a fourth patterning process, wherein the common electrode is provided on the passivation layer.

2. The method for manufacturing the organic thin film transistor array substrate according to claim 1, wherein forming the pattern comprising the source electrode, the drain electrode, the data line and the pixel electrode on the transparent substrate through the first patterning process comprises:
   depositing a first transparent conductive layer, a first metal layer and a photoresist on the transparent substrate, performing an etching with a photoresist pattern after an exposure and development process so as to form a channel, and then, after an ashing process is performed on the photoresist, performing an etching on the remaining photoresist pattern, so as to form the pattern comprising the source electrode, the drain electrode and the data line, which are formed by the first metal layer, and the pixel electrode, which is formed by the first transparent conductive layer.

3. The method for manufacturing the organic thin film transistor array substrate according to claim 1, wherein forming the organic semiconductor pattern, the gate insulating layer pattern, the pattern comprising the gate electrode and the gate line through the second patterning process on the transparent substrate after the first patterning process comprises:
- depositing an organic semiconductor layer on the transparent substrate after the first patterning process;
- coating a gate insulating layer on the transparent substrate;
- depositing a second metal layer on the transparent substrate;
- coating photoresist on the transparent substrate, and performing an etching after an exposure and development process, so as to form the pattern comprising the organic semiconductor pattern formed by the organic semiconductor layer, the gate insulating layer pattern formed by the gate insulating layer, and the gate electrode and the gate line formed by the second metal layer.

4. The method for manufacturing the organic thin film transistor array substrate according to claim 3, wherein the deposited organic semiconductor layer has a thickness of 30-150 nm.

5. The method for manufacturing the organic thin film transistor array substrate according to claim 4, wherein the deposited organic semiconductor layer has a thickness of 50 nm.

6. The method for manufacturing the organic thin film transistor array substrate according to claim 3, wherein the deposited organic semiconductor layer is an organic semiconductor layer of vanadyl phthalocyanine.

7. The method for manufacturing the organic thin film transistor array substrate according to claim 3, wherein the deposited gate insulating layer is baked for 5-25 minutes before a temperature reaches 60-100° C. and baked for 5-25 minutes after the temperature reaches 100-180° C., and the gate insulating layer has a thickness of 250-600 nm.

8. The method for manufacturing the organic thin film transistor array substrate according to claim 7, wherein the deposited gate insulating layer is baked for 20 minutes before the temperature reaches 100° C. and baked for 20 minutes after the temperature reaches 130° C., and the gate insulating layer has a thickness of 550 nm.

9. The method for manufacturing the organic thin film transistor array substrate according to claim 3, wherein the deposited gate insulating layer is an insulating layer of polyvinyl phenol.

10. The method for manufacturing the organic thin film transistor array substrate according to claim 3, wherein Mo is used for the deposited second metal layer.

11. An organic thin film transistor array substrate, comprising:
- a transparent substrate;
- a pixel electrode disposed on the transparent substrate;
- a source electrode, a drain electrode and a data line disposed on the transparent substrate;
- an organic semiconductor pattern disposed on the transparent substrate;
- a gate insulating layer pattern disposed on the transparent substrate;
- a gate electrode and a gate line disposed on the transparent substrate;
- a passivation layer disposed on the transparent substrate and a data line pad region, a gate line pad region and a pixel pad region formed in the passivation layer; and
- a common electrode disposed on the transparent substrate, wherein the common electrode is provided on the passivation layer.

12. The organic thin film transistor array substrate according to claim 11, wherein the organic semiconductor pattern has a thickness of 30-150 nm.

13. The organic thin film transistor array substrate according to claim 12, wherein the organic semiconductor pattern has a thickness of 50 nm.

14. The organic thin film transistor array substrate according to claim 11, wherein an organic semiconductor of vanadyl phthalocyanine is used for the organic semiconductor pattern.

15. The organic thin film transistor array substrate according to claim 11, wherein the gate insulating layer has a thickness of 250-600 nm.

16. The organic thin film transistor array substrate according to claim 15, wherein the gate insulating layer has a thickness of 550 nm.

17. The organic thin film transistor array substrate according to claim 11, wherein the gate insulating layer is an insulating layer of polyvinyl phenol.

18. A display device comprising an organic thin film transistor array substrate according to claim 11.

* * * * *